United States Patent
Endo et al.

(10) Patent No.: US 6,936,401 B2
(45) Date of Patent: Aug. 30, 2005

(54) PATTERN FORMATION MATERIAL AND PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/610,912

(22) Filed: Jul. 2, 2003

(65) Prior Publication Data

US 2004/0013978 A1 Jan. 22, 2004

(30) Foreign Application Priority Data

Jul. 15, 2002 (JP) .................................. 2002-205766

(51) Int. Cl.⁷ .................................................. G03C 1/73
(52) U.S. Cl. .................... 430/270.1; 430/325; 430/914; 430/919; 430/320
(58) Field of Search .................. 430/270.1, 325, 430/914, 919, 320

(56) References Cited

U.S. PATENT DOCUMENTS 5,650,261 A * 7/1997 Winkle .................... 430/270.1
6,395,451 B1 * 5/2002 Jung et al. ............... 430/270.1
2004/0259040 A1 * 12/2004 Endo et al. ................ 430/322

FOREIGN PATENT DOCUMENTS

WO      WO 00/17712      3/2000

OTHER PUBLICATIONS

Shirai et al., "Photoacid and photobase generators: Chemistry and applications to polymeric materials", Progress in Polymer Science, vol. 21, Issue 1, 1996, pp. 1–45.*
Wright et al., "Positive and Negative Tone Protein Patterning on a Photobase Gernerating Polymer", Langmuir, 2003, vol. 19, pp. 446–452.*

* cited by examiner

*Primary Examiner*—Yvette C. Thornton
(74) *Attorney, Agent, or Firm*—McDermott Will & Emery LLP

(57) ABSTRACT

The pattern formation material of this invention is a chemically amplified resist material including a polymer whose solubility in a developer is changed in the presence of an acid; an acid generator for generating an acid through irradiation with exposing light; and a base generator for generating a base through irradiation with the exposing light. The base generator is more photosensitive to longer band light of a wavelength longer than extreme UV than to extreme UV when irradiated, as the exposing light, with the extreme UV and the longer band light at equivalent exposure energy.

2 Claims, 2 Drawing Sheets

PATTERN FORMATION MATERIAL AND PATTERN FORMATION METHOD

BACKGROUND OF THE INVENTION

The present invention relates to a pattern formation material and a pattern formation method for use in semiconductor fabrication process and the like.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like. Also, in order to form a fine pattern of a rule of a 0.1 µm or less, and more particularly, of 70 nm or less, use of exposing light of a further shorter wavelength, such as vacuum UV like $F_2$ laser (of a wavelength of a 157 nm band) or extreme UV (of a wavelength of a 1 nm through 30 nm band) as well as use of EB employing EB projection exposure or the like is being studied.

Among these exposing light, extreme UV is particularly promising because it can be used for forming a pattern of a rule of 50 nm or less.

Now, a conventional pattern formation method will be described with reference to FIGS. 2A through 2D.

First, a chemically amplified resist material having the following composition is prepared:

| | |
|---|---|
| Base polymer: poly((p-t-butyloxycarbonyloxystyrene) - (hydroxystyrene)) (wherein p-t-butyloxycarbonyloxy-styrene:hydroxystyrene = 40 mol %:60 mol %) | 4.0 g |
| Acid generator: triphenylsulfonium nonafluorobutanesulfonate | 0.12 g |
| Solvent: propylene glycol monomethyl ether acetate | 20 g |

Next, as shown in FIG. 2A, the aforementioned chemically amplified resist material is applied on a substrate 1, so as to form a resist film 2 with a thickness of 0.15 µm. Thereafter, as shown in FIG. 2B, the resist film 2 is selectively irradiated with extreme UV 3.

Then, as shown in FIG. 2C, the substrate 1 is annealed with a hot plate at a temperature of 100° C. for 60 seconds. Thus, an exposed portion 2a of the resist film 2 becomes soluble in an alkaline developer because an acid is generated from the acid generator therein while an unexposed portion 2b of the resist film 2 remains to be insoluble in an alkaline developer because no acid is generated from the acid generator therein.

Next, the resist film 2 is developed with a 2.38 wt % tetramethylammonium hydroxide developer. In this manner, a resist pattern 4 with a line width of 0.07 µm made of the unexposed portion 2b of the resist film 2 can be obtained.

In a pattern formation method, a highly accurate optical system is necessary, and in a general optical system for introducing extreme UV to a resist film, the resist film is occasionally irradiated with not only the extreme UV but also longer band light of a wavelength longer than the extreme UV. This is also derived from a light source of the exposing light.

On the other hand, a chemically amplified resist material used in a pattern formation method employing extreme UV as exposing light is set so that an acid can be generated through irradiation with the extreme UV for changing the solubility of a polymer in a developer.

Therefore, in the case where the general optical system is used for irradiating a resist film with extreme UV, when the resist film is irradiated with not only the extreme UV but also the longer band light of a wavelength longer than the extreme UV, the chemically amplified resist material is sensitized to the longer band light. This lowers the optical contrast between an exposed portion and an unexposed portion of the resist film, and as a result, there arises a problem that the resultant resist pattern is in a defective shape.

Accordingly, as shown in FIG. 2D, the conventional resist pattern is in a defective cross-sectional shape. When such a resist pattern in a defective shape is used for etching a target film, the resultant pattern is also in a defective shape.

SUMMARY OF THE INVENTION

In consideration of the aforementioned conventional problem, an object of the invention is forming a resist pattern in a good pattern shape even when a resist film is irradiated with extreme UV by using a general optical system.

In order to achieve the object, the pattern formation material of this invention is composed of a chemically amplified resist material including a polymer whose solubility in a developer is changed in the presence of an acid; an acid generator for generating an acid through irradiation with exposing light; and a base generator for generating a base through irradiation with the exposing light, and the base generator is more photosensitive to longer band light of a wavelength longer than extreme UV than to extreme UV when irradiated, as the exposing light, with the extreme UV and the longer band light at equivalent exposure energy.

According to the pattern formation material of this invention, the chemically amplified resist material includes the base generator that is more photosensitive to the longer band light than to the extreme UV when it is irradiated with the extreme UV and the longer band light of a wavelength longer than the extreme UV at the equivalent exposure energy. Therefore, even when a resist film is irradiated with the longer band light of a wavelength longer than the extreme UV, a comparatively large amount of base is generated from the base generator in an exposed portion of the resist film and neutralizes the acid generated from the acid generator, so as to improve optical contrast. As a result, the cross-sectional shape of a resist pattern formed by using this pattern formation material can be improved.

In the pattern formation material of this invention, the base generator is preferably acetophenone-O-acryloyloxime, benzophenone-O-acryloyloxime or naphtophenone-O-acryloyloxime.

Thus, the base is definitely generated to neutralize the acid when the resist film is irradiated with the longer band light of a wavelength longer than the extreme UV, so as to improve the optical contrast.

The pattern formation method of this invention includes the steps of forming a resist film made of a chemically amplified resist material, the chemically amplified resist material including a polymer whose solubility in a developer is changed in the presence of an acid; an acid generator that generates an acid through irradiation with exposing light; and a base generator that generates a base through irradiation with the exposing light and is more photosensitive to longer band light of a wavelength longer than extreme UV than to extreme UV when irradiated, as the exposing light, with the extreme UV and the longer band light at equivalent exposure energy; performing pattern exposure by selectively irradiating the resist film with extreme UV; and forming a resist pattern by developing the resist film after the pattern exposure.

According to the pattern formation method of this invention, the chemically amplified resist material includes the base generator that is more photosensitive to the longer band light than to the extreme UV when it is irradiated with the extreme UV and the longer band light of a wavelength longer than the extreme UV at the equivalent exposure energy. Therefore, even when the resist film is irradiated with the longer band light of a wavelength longer than the extreme UV, a comparatively large amount of base is generated from the base generator in an exposed portion of the resist film and neutralizes the acid generated from the acid generator, so as to improve optical contrast. As a result, the cross-sectional shape of the resist pattern formed by this pattern formation method can be improved.

In the pattern formation method of this invention, the base generator is preferably acetophenone-O-acryloyloxime, benzophenone-O-acryloyloxime or naphtophenone-O-acryloyloxime.

Thus, the base is definitely generated to neutralize the acid when the resist film is irradiated with the longer band light of a wavelength longer than the extreme UV, so as to improve the optical contrast.

DETAILED DESCRIPTION OF THE INVENTION

Now, a pattern formation method according to an embodiment of the invention will be described with reference to FIGS. 1A through 1D.

First, a chemically amplified resist material having the following composition is prepared:

| | |
|---|---|
| Base polymer: poly((p-t-butyloxycarbonyloxystyrene) - (hydroxystyrene)) (wherein p-t-butyloxycarbonyloxy-styrene:hydroxystyrene = 40 mol %:60 mol %) | 4.0 g |
| Acid generator: triphenylsulfonium nonafluorobutanesulfonate | 0.12 g |
| Base generator: acetophenone-O-acryloyloxime | 0.08 g |
| Solvent: propylene glycol monomethyl ether acetate | 20 g |

Figure 1A:
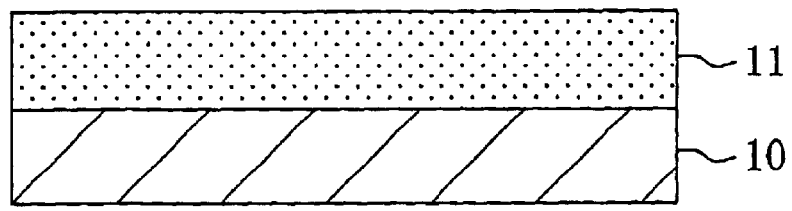
FIGS. 1A, 1B, 1C and 1D are cross-sectional views for showing procedures in a pattern formation method according to an embodiment of the invention.
Figure 1B:
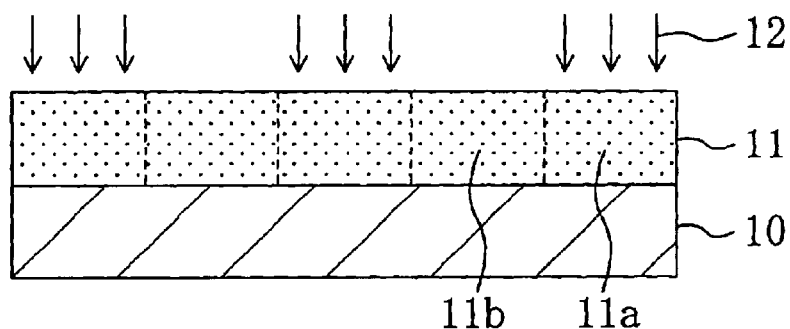

Next, as shown in FIG. 1A, the aforementioned chemically amplified resist material is applied on a substrate 10, so as to form a resist film 11 with a thickness of 0.15 µm. Thereafter, as shown in FIG. 1B, the resist film 11 is selectively irradiated with extreme UV 12.

Figure 1C:
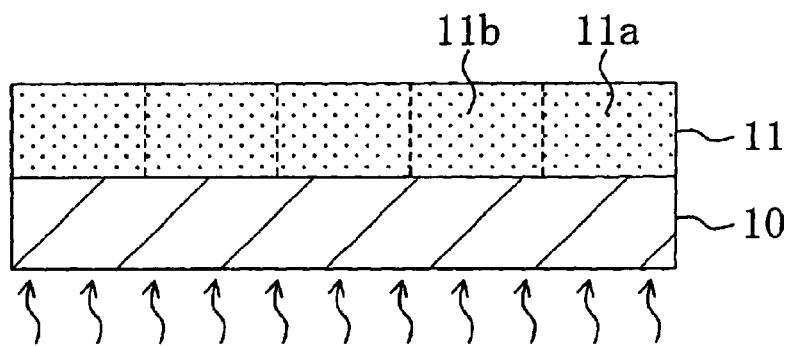

Then, as shown in FIG. 1C, the substrate 10 is annealed at a temperature of 100° C. for 60 seconds. Thus, an exposed portion 11a of the resist film 11 becomes soluble in an alkaline developer because an acid is generated from the acid generator therein while an unexposed portion 11b of the resist film 11 remains to be insoluble in an alkaline developer because no acid is generated from the acid generator therein. In this case, although the extreme UV 12 includes longer band light of a wavelength longer than a 1 nm through 30 nm band, since the base generator for generating a comparatively large amount of base through irradiation with the longer band light is included in the chemically amplified resist material, a comparatively large amount of base is generated in the exposed portion 11a of the resist film 11 so as to neutralize the acid generated from the acid generator. As a result, the influence of the longer band light included in the extreme UV 12 can be reduced, so as to improve optical contrast against the extreme UV of a wavelength of a 1 nm through 30 nm band.

Figure 1D:
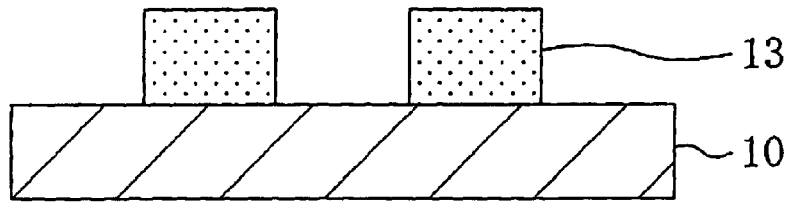
Figure 2A:
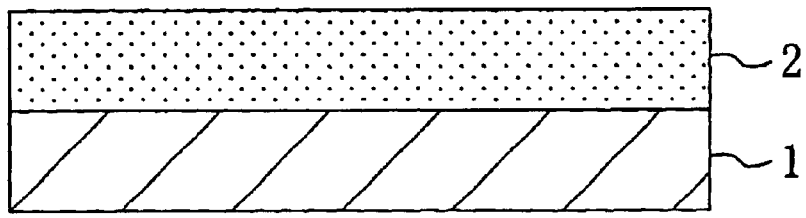
FIGS. 2A, 2B, 2C and 2D are cross-sectional views for showing procedures in a conventional pattern formation method.
Figure 2B:
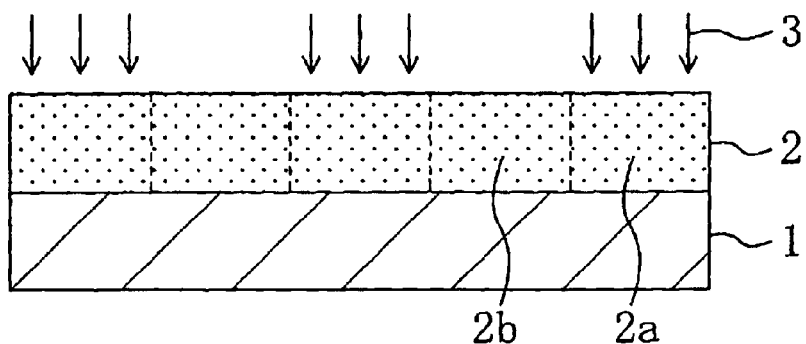
Figure 2C:
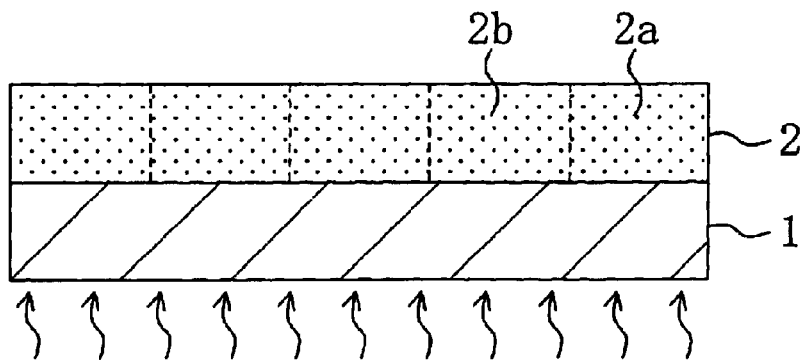
Figure 2D:
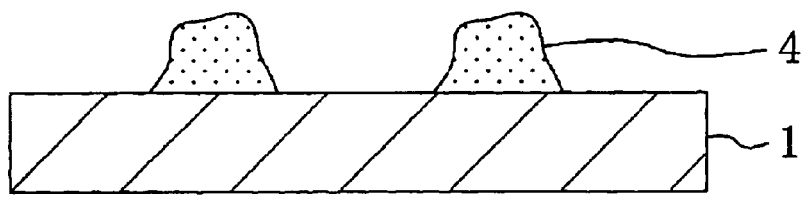

Next, the resist film 11 is developed with a 2.38 wt % tetramethylammonium hydroxide developer. Thus, as shown in FIG. 1D, a resist pattern 13 with a line width of 0.07 µm made of the unexposed portion 11b of the resist film 11 can be formed in a good shape.

According to the embodiment of the invention, the chemically amplified resist material includes the base generator that is more photosensitive to the longer band light of a longer wavelength than to the extreme UV when irradiated with the extreme UV and the longer band light at equivalent exposure energy. Therefore, even when the resist film 11 is irradiated with the longer band light of a wavelength longer than the extreme UV, a comparatively large amount of base is generated from the base generator in the exposed portion 11a of the resist film 11 and neutralizes the acid generated from the acid generator, so as to improve the optical contrast. Accordingly, the resultant resist pattern 13 is in a good cross-sectional shape.

Although the chemically amplified resist material used in this embodiment is a positive resist material, the present invention can exhibit the same effect in using a negative chemically amplified resist material.

Although acetophenone-O-acryloyloxime is used as the base generator in this embodiment, it may be replaced with another base generator such as benzophenone-O-acryloyloxime or naphtophenone-O-acryloyloxime, which does not limit the invention.

What is claimed is:

1. A pattern formation material comprising a chemically amplified resist material including a polymer whose solubility in a developer is changed in the presence of an acid; an acid generator for generating an acid through irradiation with exposing light; and a base generator for generating a base through irradiation with said exposing light, wherein said base generator is more photosensitive to a longer band light of a wavelength longer than an extreme UV than to said extreme UV when irradiated, as said exposing light, with said extreme UV and said longer band light at equivalent exposure enery, and said base generator is acetophenone-O-acryloyloxime, benzophenone-O-acryloyloxime or naphtophenone-O-acryloyloxime.

2. A pattern formation method comprising the steps of:

forming a resist film including a chemically amplified resist material, said chemically amplified resist material having a polymer whose solubility in a developer is changed in the presence of an acid; an acid generator that generates an acid through irradiation with exposing light; and a base generator that generates a base through irradiation with said exposing light and is more photosensitive to a longer band light of a wavelength longer than an extreme UV than to said extreme UV when irradiated, as said exposing light, with said extreme UV and said longer band light at equivalent exposure energy;

performing pattern exposure by selectively irradiating said resist film with said exposing light including said extreme UV and said longer band light of a wavelength longer than said extreme UV; and forming a resist pattern by developing said resist film after the pattern exposure, wherein said base generator is acetophenone-O-acryloyloxime, benzophenone-O-acryloyloxime or naphtophenone-O-acryloyloxime.

* * * * *